United States Patent [19]
Takayama

[11] Patent Number: 5,299,901
[45] Date of Patent: Apr. 5, 1994

[54] WAFER TRANSFER MACHINE

[75] Inventor: Michio Takayama, Omiya, Japan

[73] Assignee: Texas Instruments Incorporated, Dallas, Tex.

[21] Appl. No.: 869,428

[22] Filed: Apr. 16, 1992

[51] Int. Cl.⁵ .................................................. B65G 49/07
[52] U.S. Cl. ..................................... 414/404; 414/225; 414/417; 414/938
[58] Field of Search ............... 414/223, 226, 331, 416, 414/404, 405, 417, 419, DIG. 4, 225

[56] References Cited

U.S. PATENT DOCUMENTS

| | | | |
|---|---|---|---|
| 4,431,361 | 2/1984 | Bayne | 414/405 |
| 4,509,892 | 4/1985 | Redeker et al. | 414/223 |
| 4,550,242 | 10/1985 | Uehara et al. | 414/331 X |
| 4,744,715 | 5/1988 | Kawabata | 414/416 X |
| 4,770,590 | 9/1988 | Hugues et al. | 414/331 X |
| 4,806,057 | 2/1989 | Cay et al. | 414/225 |
| 4,840,530 | 6/1989 | Nguyen | 414/404 |
| 4,867,629 | 9/1989 | Iwasawa et al. | 414/331 |
| 4,938,655 | 7/1990 | Asano | 414/416 X |
| 4,947,784 | 8/1990 | Nishi | 414/404 |
| 4,952,115 | 8/1990 | Ohkase | 414/416 X |
| 4,986,729 | 1/1991 | Ohlenbusch | 414/416 X |
| 5,054,988 | 10/1991 | Shiraiwa | 414/404 |
| 5,058,526 | 10/1991 | Matsushita et al. | 414/331 X |

FOREIGN PATENT DOCUMENTS

| | | | |
|---|---|---|---|
| 0462533 | 12/1991 | European Pat. Off. | 414/223 |
| 0056228 | 3/1987 | Japan | 414/331 |
| 0057428 | 3/1988 | Japan | 414/416 |
| 0021875 | 1/1991 | Japan | 414/223 |
| 8607337 | 12/1986 | World Int. Prop. O. | 414/416 |

Primary Examiner—Michael S. Huppert
Assistant Examiner—James Keenan
Attorney, Agent, or Firm—William E. Hiller; Richard L. Donaldson

[57] ABSTRACT

The plate-shaped part (wafer) transfer machine of this invention consists of a rotatable turntable that supports the carrier; carrier pressers that are set on the turntable and are used to fix the carrier; a lifter which can move vertically with a wafer in the carrier or boat supported on it; and a guide which guides the wafer when the lifter performs vertical movement (the role of the guide is played by the wafer presser used for fixing the wafer in the carrier).

9 Claims, 18 Drawing Sheets

WAFER TRANSFER MACHINE

This invention concerns a type of wafer transfer machine. For example, this invention concerns a transfer machine for semiconductor wafers which is used for transferring the semiconductor wafer between a carrier and a quartz boat.

DESCRIPTION OF THE PRIOR ART

The semiconductor wafers (referred to as wafers hereinafter) are made of semiconductive monocrystalline silicon or gallium-arsenic, and they are prepared by slicing the ingots into thin discs. Usually, they are stored vertically in a container known as carrier, 25 wafers as a set in each carrier parallel to each other as a sequence in the horizontal direction.

In order to form a film of silicon dioxide on the surface of the wafer of, for example, silicon, it should be supported in the same state as above in a supporting means known as boat made of quartz to perform chemical vapor deposition (CVD) and oxidation processing in a thermal oxidation atmosphere. In addition, in the posttreatment stage, the wafer is carried on the boat for etching, washing and other chemical treatments. For this purpose, the wafer should be transferred from the carrier to the boat or from the boat to the carrier for transportation to the next operation.

In order to transfer the wafer between the carrier and the boat, in the conventional scheme, the wafer is transferred one piece at a time by tweezers or vacuum tweezers. However, this method has several disadvantages, such as susceptibility to scratches on the wafer, low operation efficiency, etc. Hence, the machine with its front view shown in FIG. 24 and its side view shown in FIG. 25 is adopted for transferring the wafers.

In this case, the wafer is transferred from the carrier to the boat in the following way.

Carrier (1) containing wafer W and empty boat (2) are set at the prescribed positions on table (71) (indicated by (1) in FIG. 24).

First of all, a pusher (45A) is raised from beneath carrier (1) so as to push up wafer W in carrier (1). In this case, a pair of clamps (72A), (72B) are in the stand-by state on back wall (73) above table (71). As wafer W rises between clamps (72A), (72B), it is held by clamps (72A), (72B). Then pusher (45A) is lowered to its original position (indicated by (2) in FIG. 24).

Then, with wafer W held by clamps (72A), (72B), the clamps are moved horizontally to above boat (2) (indicated by (3) in FIG. 24).

Then, pusher (45B) beneath boat (2) rises and provides a support to wafer W. The hold on the wafer by clamps (72A), (72B) is then released. Then, pusher (45B) is lowered and wafer W is set on boat (2) (see (4) in FIG. 24).

In the case when the wafer is to be transferred from the boat to the carrier, the procedure is exactly opposite to the aforementioned procedure.

In this machine, it is possible to transfer all of the 25 wafers from the carrier to the boat or from the boat to the carrier; hence, the operation efficiency is increased. However, there are the following problems left.

The wafer may be very thin. For example, the thickness of a five inch-diameter wafer is as small as 0.63 mm. Consequently, if the wafer is held by clamps (72A), (72B) with an excessive force, the wafer may be broken. Consequently, there is a high requirement on the precision for the relative positions of the various parts that form the machine, and it is very tedious to manage the machine.

In addition, if the distance over which the wafer is to be moved is long, dust may attach to the wafer when the wafer is held by clampers, released from the clampers, or set in movement. This problem becomes particularly serious when there are 4 rounds of the wafer transfer operation. If dust is attached to the wafer, the quality of the products (various semiconductor devices) is significantly degraded. Consequently, it is necessary to carry out the operation in a clean room with little dust.

Also, in the aforementioned machine, since the wafer is moved horizontally, the space occupied by the machine of its width direction is large.

OBJECT OF THE INVENTION

An object of this invention is to provide a type of transfer machine for plate-shaped parts characterized by the fact that a plurality of plate-shaped parts can be transferred either all at once or partially between a first and a second plate-shaped part containing fixtures, with no damage to the plate-shaped parts and no dust attached to the plate-shaped parts during the transferring process and with easiness for maintenance of the machine.

SUMMARY OF THE INVENTION

The first portion of the invention provides a wafer transfer machine, which is used to transfer a plate-shaped part (such as wafer W to be described later) between a first and second fixture containing a plate-shaped part (such as carrier (1) and boat (2) to be described later) in about verticality, comprises;

a first supporting means (such as carrier presser (29) to be described later) for temporarily supporting the first fixture containing a plate-shaped part in an attachable and detachable manner, a rotating means (such as turntable (12) to be described later) for rotating the first fixture containing a plate-shaped part and the first supporting means around a normal of the plate-shaped part or an axis parallel to the normal, a second supporting means (such as a wafer presser (or stopper) (16L), (16R) to be described later), which equipped on the rotating means, being capable of temporarily supporting the plate-shaped part in the first fixture containing a plate-shaped part, releasing the support, or guiding the plate-shaped part (for example, guidance by groove (16a) to be described later), and a third support means (such as lifter (45) to be described later), being capable of moving reciprocally, for transferring the plate-shaped part from a first support position which is held by the second supporting means in the first fixture containing a plate-shaped part, to a second support position in the second fixture containing a plate-shaped part after the plate-shaped part is rotated by the rotating means.

The second portion of the invention provides a wafer transfer machine according to the first portion of the invention, when the plate-shaped part is transferred from the second fixture containing a plate-shaped part to the first fixture containing a plate-shaped part, wherein:

the plate-shaped part in the second fixture containing a plate-shaped part is transferred into the first fixture containing a plate-shaped part by the third supporting means, the plate-shaped part in the first fixture containing a plate-shaped part is supported by the second supporting means, and the first fixture containing a plate-shaped part is rotated by a predetermined angle by the rotating means after releasing the third supporting means.

Figure 1:
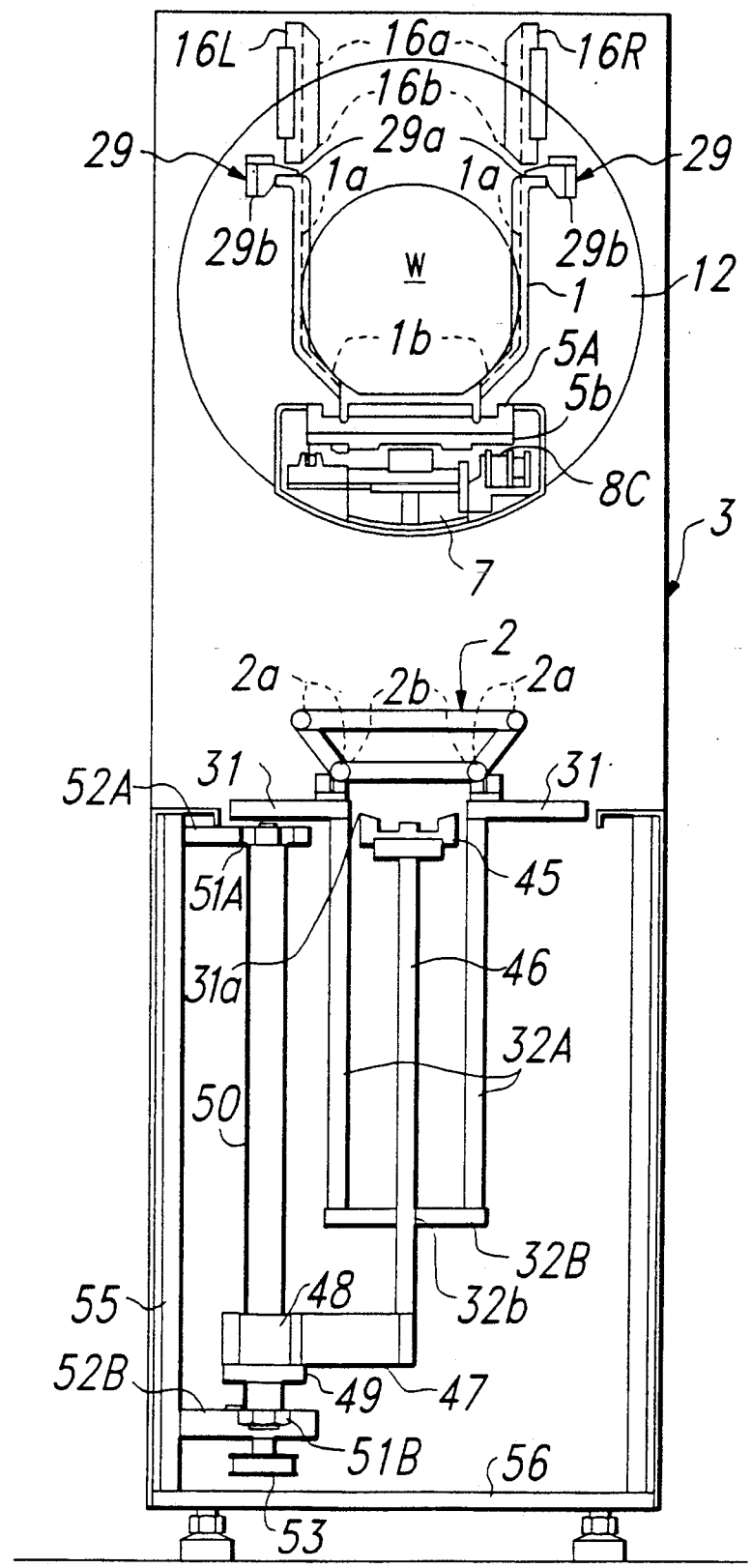
FIG. 1 is a schematic front view illustrating the interior of the wafer transfer machine in step 1 of the wafer transferring process in a first embodiment.

In reference numerals as shown in the drawings:
1, 61, carrier
1a, 2a, 16a, 61a, grooves
1b, 2b, 16b, 61b, groove bottom
2, boat
5A, 62, 63, 64, carrier table
12, 66, turntable
16 L, 16 R, wafer presser and guide
17L, 17R, 18L, 18R, 19L, 19R, links
29, carrier presser
30, air cylinder
31, boat table
33, 48, socket of ball screw
36, 50, ball screw
45, 65, lifter
46, 66, lifter support plate
W, wafer

DESCRIPTION OF THE PREFERRED EMBODIMENTS

In the following, this invention will be explained with reference to respective embodiments.

Figure 18:
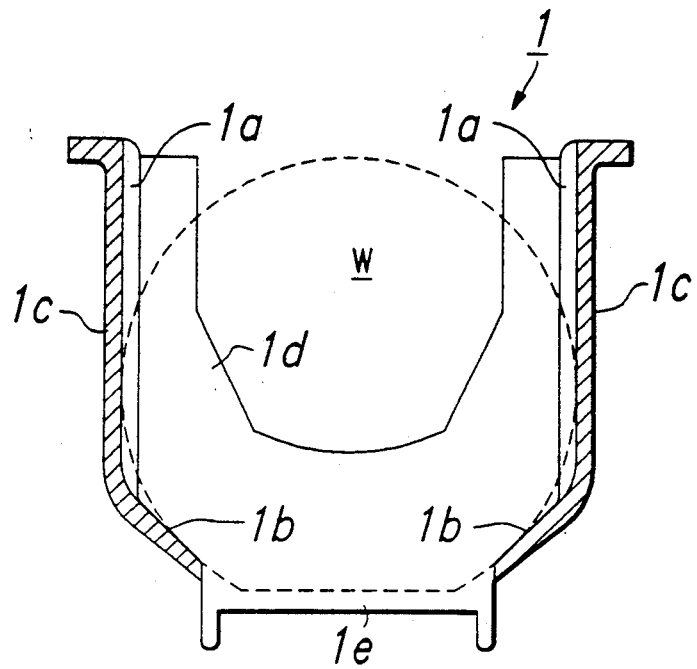
FIG. 18 is a cross-sectional view of the carrier.

FIG. 18 is a cross-sectional view of a carrier cut at the position of the groove used to contain the wafer. On side walls (1c), (1c) of carrier (1), grooves (1a), (1a) are arranged. Wafer W (indicated by the dash-dot line) is supported and contained in carrier (1) as it is in contact with bottom sides (1b), (1b) of the lower curved portions of grooves (1a), (1a). Usually, 25 pairs of grooves (1a), (1a) are arranged. Side walls (1c), (1c) are connected to each other by front and back side of wall (1d); the lower portion of the carrier forms space (1e) which allows passage of the lifter to be described later.

Figure 19:
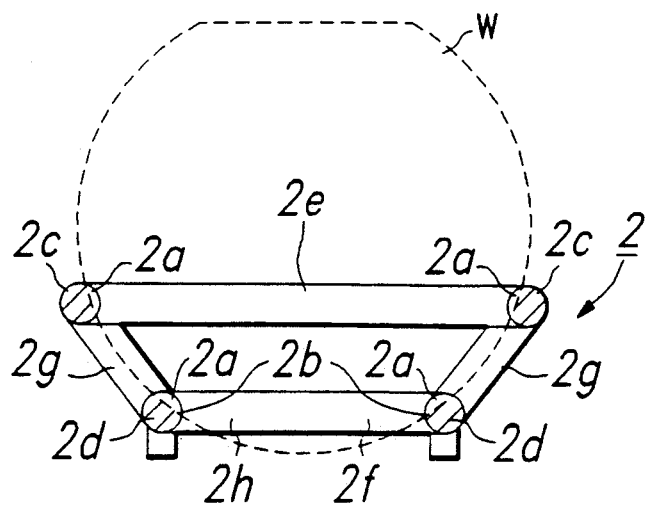
FIG. 19 is a front view of the boat.

FIG. 19 is also a cross-sectional view just as FIG. 18. In the front and back sides (in the direction perpendicular to the paper) boat (2) has a pair of beams (2c), (2c), and a pair of beams (2d), (2d). Beams (2c), (2c) are connected to each other by a pair of beams (2e), beams (2d), (2d) are connected to each other by a pair of beams (2f). Beams (2c), (2c) and beams (2d), (2d) are connected to each other by columns (2g), (2g) and are fixed with respect to each other. On beams (2c), (2c), (2d), (2d), grooves (2a@l, (2a), (2a), (2a) into which a portion of the periphery of wafer W (indicated by the dash-dot line) are arranged. Wafer W is in contact with the bottom sides (2b), (2b) of grooves (2a), (2a) of lower-side beams (2d), (2d), and is contained and supported by boat (2) in this way. Boat (2) is made of quartz. Space (2h) formed between a pair of beams (2f) that connect beams (2d), (2d) allows passage of the lifter to be described later.

FIGS. 1-7 are front views of the main portion inside the wafer transfer machine illustrating the procedure of transference of the wafer from the carrier to the boat. FIG. 8 is a side view of the main portion of the interior of the wafer transfer machine in the state shown in FIG. 2. In FIG. 8, the carrier is indicated by the dash-dot line, while the boat and wafer are not shown.

Basket (3) of the machine consists of an upper basket portion (3A) and a lower basket portion (3B). On base plate (56) of basket (3), first column (4) and second column (55) are erected. For first column (4), most of its lower portion (4B) is contained in lower basket portion (3B), while its upper portion (4A) goes into upper basket portion (3A). As shown in FIG. 1, second column (55) is located on the left side in lower basket portion (3B). In this figure, (3A) represents the back panel of basket (3).

A motor (15) is fixed on upper portion (4A) of first column (4); a turntable (12) is fixed on passive shaft (13) of reducing gear (14). Turntable (12) forms the largest portion in front of upper basket portion (3A). In front of upper basket portion (3A), carrier table (5A), carrier presser (29), and left and right wafer pressers (16L) and (16R) are installed on turntable (12). Under driving by motor (15), they are made to rotate together with the rotation of turntable (12).

A pair of brackets (38A), (38B) are fixed on lower portion (4B) of first column (4) and bearings (37A), (37B), which support the two end portions of ball screw (36), are mounted on brackets (38A), (38B). Between brackets (38A) and (38B), a guide rail (44C) is installed on the lower portion (4B) of first column (4). Socket (33) of ball screw is engaged with ball screw (36). A belt (39C) is set to connect pulley (39A) on the lower end of ball screw (36) and pulley (39B) mounted on passive shaft (40a) of reducing gear (40) connected to motor (41).

A donut-shaped base plate (34) is fixed on the lower side of socket (33). Via bracket (35), base plate (34) supports a pair of boat table support columns (32A). As shown in FIG. 8, on the right side of bracket (35), a guide support portion (44A) is erected. Guide (44B) is fixed on guide support portion (44A). Under driving of motor (41), socket (33) is moved up and down due to rotation of ball screw (36). As a result, boat table support column (32A) is moved up and down as guided by guide (44B) on guide rail (44C) mounted on lower portion (4B) of first column (4). As boat table support column (32A) is moved up and down, boat table (31) supported on its upper portion (32a) is made to move up and down.

In FIG. 8, the lowest position of boat table (31) is indicated by a solid line, and the highest position is indicated by a dash-dot line. Positioning at the lowest position in the up-down movement is carried out as stopper (57A) mounted on bracket (38C) fixed on lower portion (4B) of first column (4) comes into contact with bracket (35). Positioning at the highest position in the up-down movement is carried out as stopper (57B) mounted on bracket (38A) comes into contact with guide support portion (44A). Stoppers (57A), (57B) are made of bolts, and they are fixed by nuts in an adjustable way in the vertical direction on brackets (38C) and (38A), respectively.

With the aid of stoppers (57A), (57B) and the guidance by guide (44B) on guide rail (44C), boat table (31) can be moved vertically to the correct position.

A pair of brackets (52A), (52B) are fixed on second column (55). Bearings (51A), (51B) are mounted on brackets (52A), (52B), respectively. The two end portions of ball screw (50) are supported by bearings (51A), (51B). Socket (48) of ball screw is engaged with ball screw (50), and the lower side of socket (48) is fixed on donut-shaped support plate (49). Lifter support plate (46) is fixed via bracket (47) on support plate (49). A belt (not shown in the figure) is set to couple pulley (53) mounted on the lower end portion of ball screw (50) and a pulley mounted on the passive shaft of a reducing gear connected to the motor.

A [lifter] (45) for supporting the wafer to make the vertical movement is fixed on lifter support plate (46). Socket (48) makes up or down movement as ball screw (50) rotates in the forward or backward directions driven by the aforementioned motor, and as a result, lifter (45) makes an up or down movement. Lifter support plate (46) is inserted in a sliding way into a rectangular-shaped through hole (32b) on connecting plate (32B) that connects the lower ends of a pair of boat table support columns (32A), (32A), and is guided by said through hole (32b). In this configuration, lifter (45) can make vertical movement to the desired correct position. As shown in FIG. 8, lifter (45) is located below carrier table (5A) in front of upper basket portion (3A).

In the following, the procedure for transferring the wafer from the carrier to the boat will be explained with reference to FIGS. 1-7.

First of all, as shown in FIG. 1, carrier (1) with wafer W contained in it is set on carrier table (5A) at the prescribed position. In the figure, (1a) is the groove arranged on the carrier side wall for holding wafer W. The aforementioned movement to the prescribed position is carried out by rotating toothed belt (11) so as to move carrier table (5A) on said toothed belt (11) as shown in FIG. 8.

Figure 8:
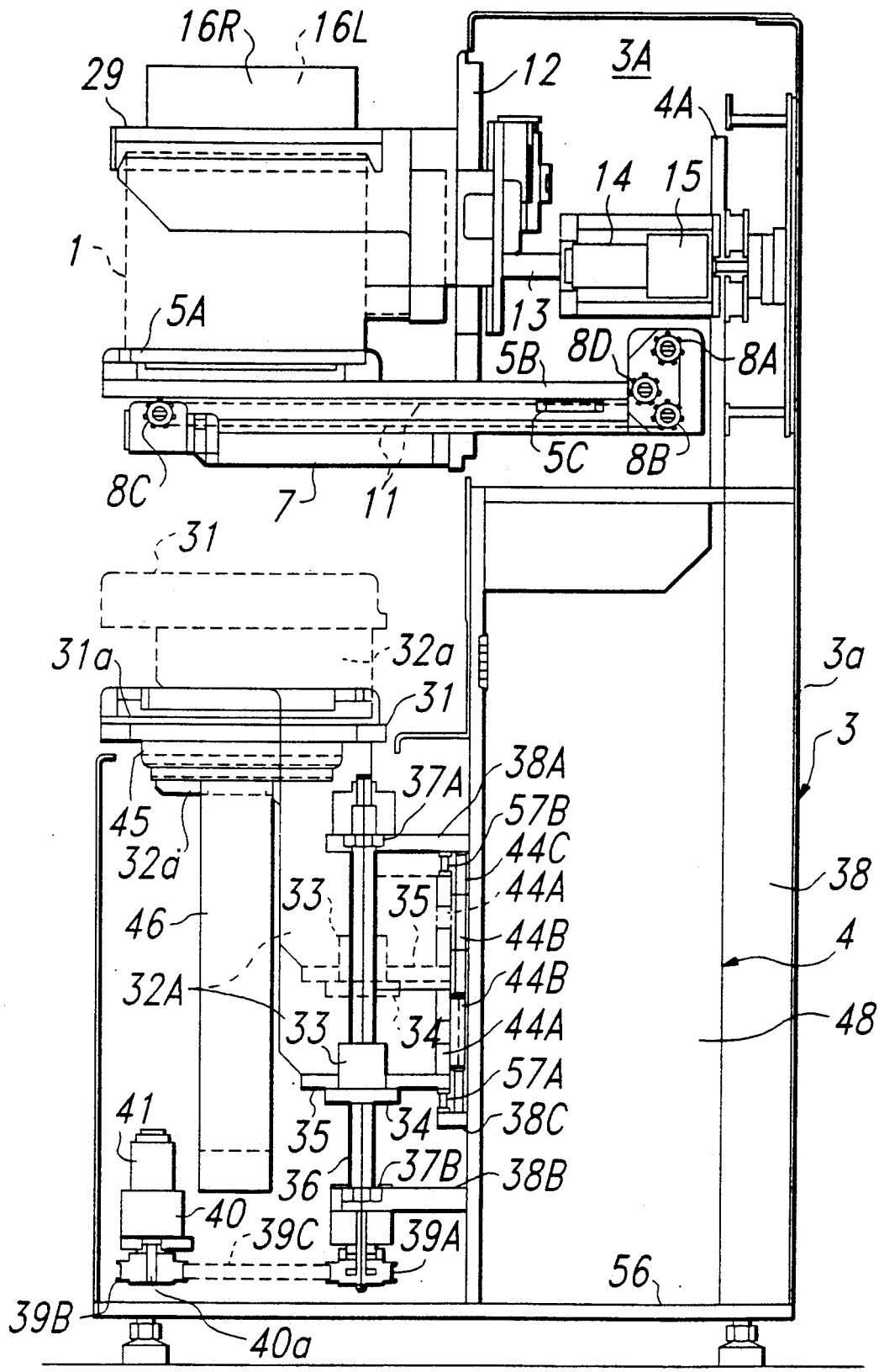
FIG. 8 is a schematic side view of the interior in step 2 in said embodiment.
Figure 9:
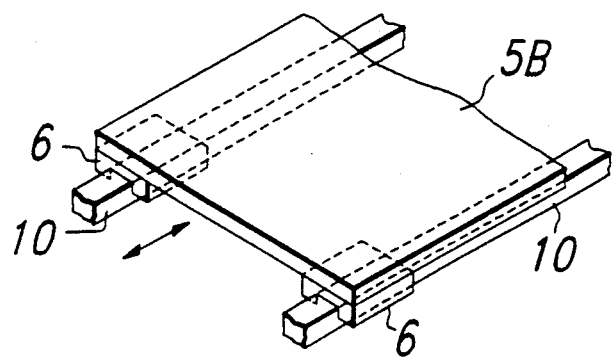
FIG. 9 is a schematic oblique view illustrating the movement feature of the supporting plate for supporting carrier table in the first embodiment.

Driving pulley (8A) and passive pulleys (8B), (8D) are set in upper basket portion (3A). These pulleys (8A), (8B), (8D) and passive pulley (8C) set on the tip portion of bracket (7) in front of upper basket portion (3A) are engaged with a toothed belt (11), on which support plate (5B) that supports carrier table (5A) is mounted via mounting portion (5C). As driving pulley (8A) is driven by a motor not shown in the figure, carrier table (5A) is moved from the left side to the right side in FIG. 8, and carrier (1) stops at the prescribed position. As shown in FIG. 9, support plate (5B) is guided by guides (6), (6) fixed on the side edges on its lower side striding on guide rails (10), (10), and it makes a reciprocal movement as described in the above.

Figure 2:
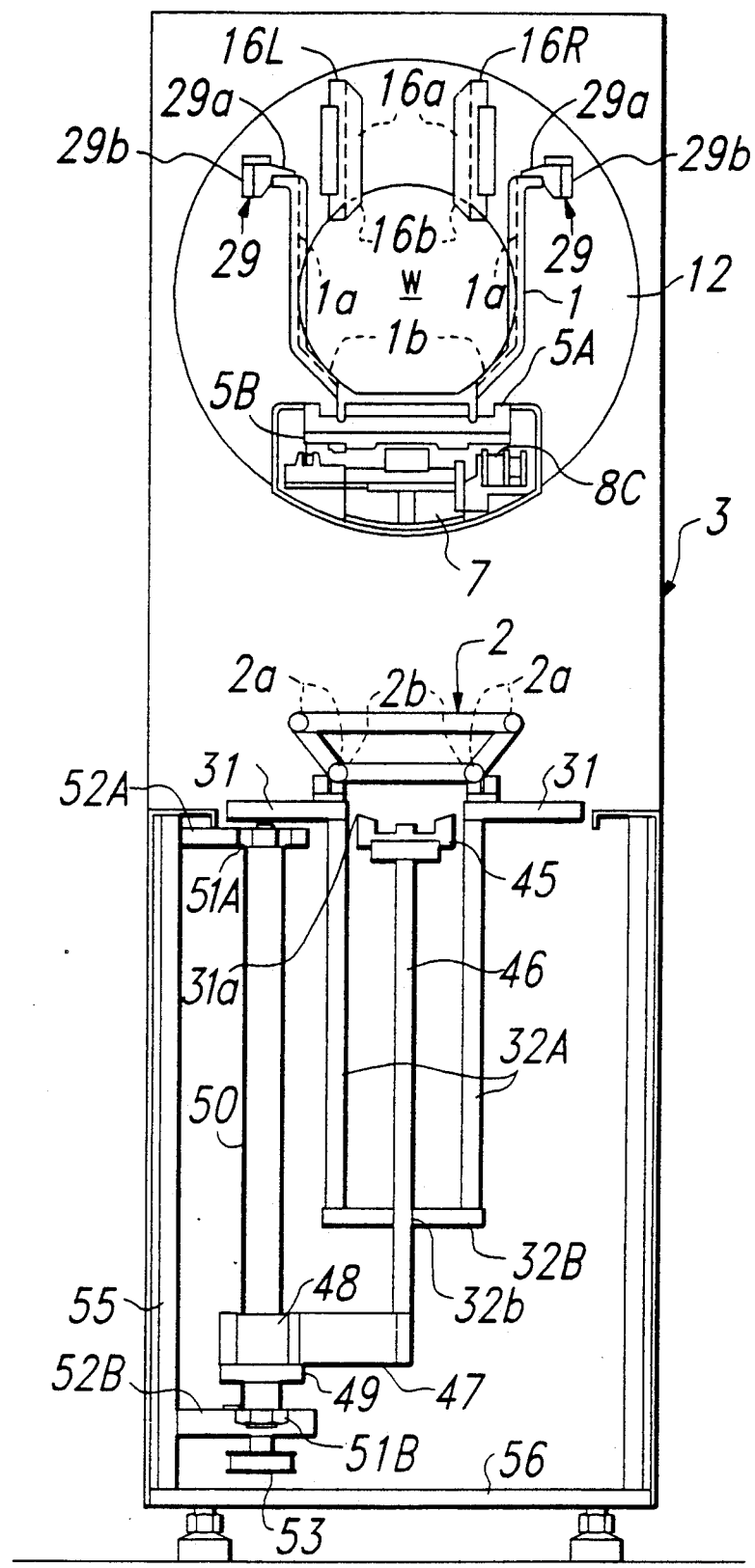
FIG. 2 is a schematic front view illustrating the interior in step 2 of the wafer transferring process in said embodiment.

Then, as shown in FIG. 2, carrier presser (29) is lowered, its left and right claws (29a), (29a) are pressed on the two side edges on the upper end surface of carrier (1) so that carrier (1) is fixed. Then (or at the same time), left and right wafer pressers (16L), (16R) are moved to the lower inner side to press on wafer W.

Figure 10:
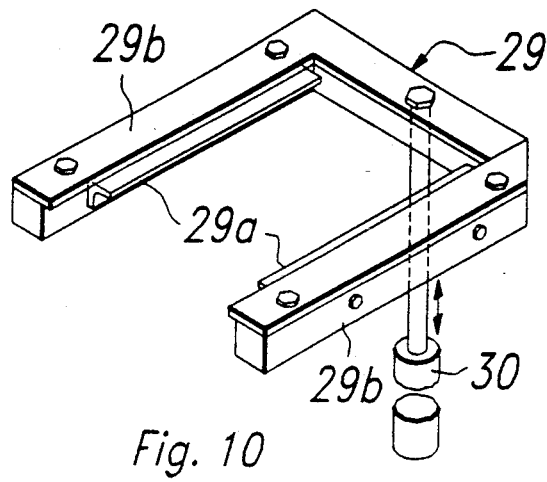
FIG. 10 is a schematic oblique view illustrating the feature of vertical movement of the carrier presser in said embodiment.

As shown in FIG. 10, carrier presser (29) has a U shape. It is made to move vertically under driving of air cylinder (30). As it is lowered, claws (29a), (29a) fixed on the left and right arms (29b), (29b) hold carrier (1) as described in the above.

Figure 11:
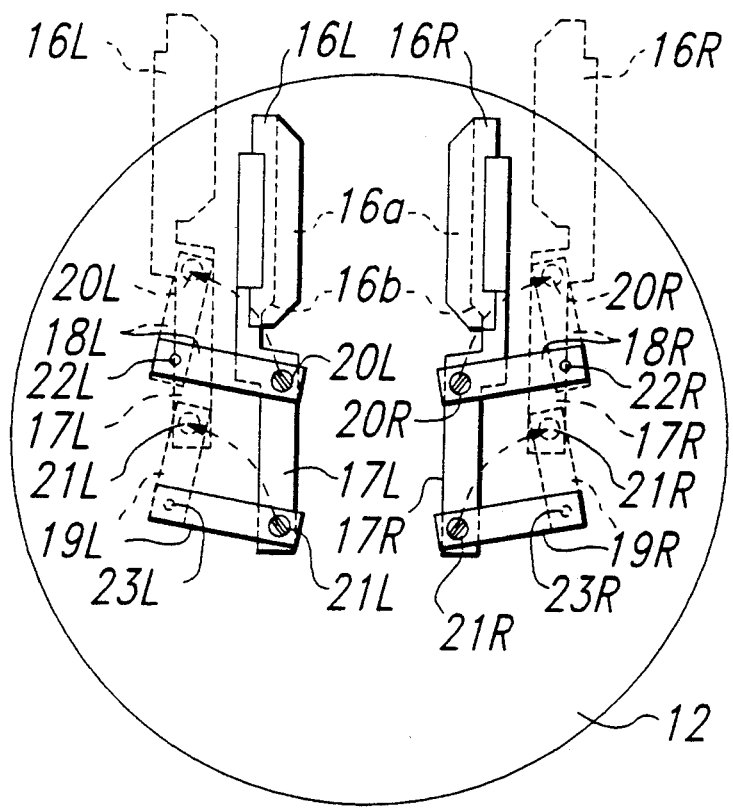
FIG. 11 is a schematic front view illustrating the movement mechanism of the wafer presser in said embodiment.

As shown in FIG. 11, the movement of wafer pressers (16L), (16R) is performed by a link mechanism. That is, wafer pressers (16L), (16R) are fixed on the upper ends of first links (17L), (17R). On the 2 locations on first links (17L), (17R), second links (18L), (18R) are mounted in a rotatable way by shafts (20L), (20R), and third links (19L), (19R) are mounted in a rotatable way by shafts (21L), (21R), respectively. Second links (18L), (18R) are mounted in a rotatable way on turntable (12) with the aid of shafts (22L), (22R), respectively. Third links (19L), (19R) are fixed on shafts (23L), (23R) which penetrate turntable (12), respectively. In FIG. 11, the state of FIG. 1 is represented by a dash-dot line, while the state of FIG. 2 is represented by a solid line (the same as in FIG. 13 to be described later). As shafts (23L), (23R) are rotated, first, second, and third links (17L), (17R), (18L). (18R), (19L), (19R) are made to rotate between the position indicated by the dash-dot line and the position indicated by the solid line, and wafer pressers (16L), (16R) mounted on first links (17L), (17R) make arc movement.

Figure 12:
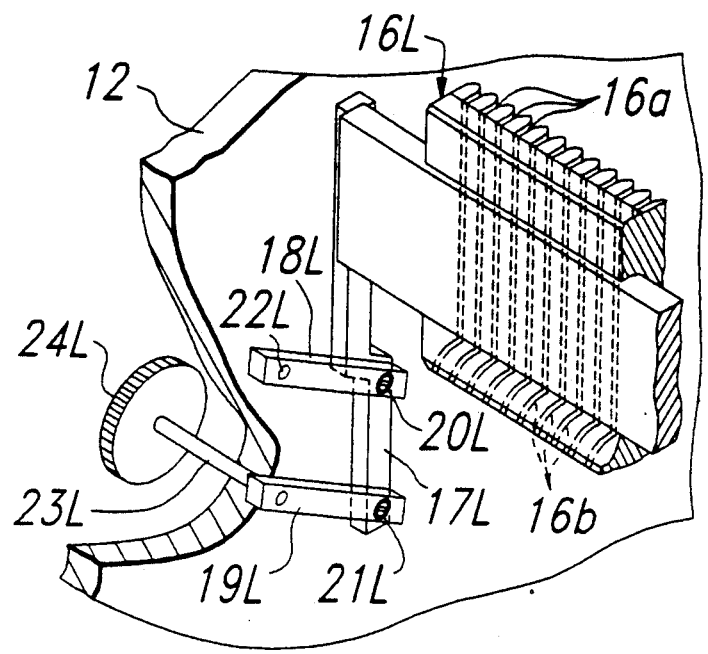
FIG. 12 is a schematic oblique view illustrating the movement mechanism of the wafer presser in said embodiment.

FIG. 12 is a schematic oblique view of the main portion of the link mechanism on the left side in the state shown in FIG. 2. As passive spur gear (24L) mounted on shaft (23L) on the back side of turntable (12) is rotated, wafer presser (16L) performs the aforementioned arc movement. On the inner side of wafer presser (16L) (same in the case of (16R)), grooves (16a) for guiding the wafer movement in the step shown in FIG. 6 to be described later are arranged with a number equal to the number of the wafers. The lower end of groove (16a) is formed in an arc shape in conformance with the circumference of the wafer. Wafer pressers (16L), (16R) press wafer W on the arc-shaped bottom surface (16b) on the lower end of groove (16a) (FIG. 2).

Figure 13:
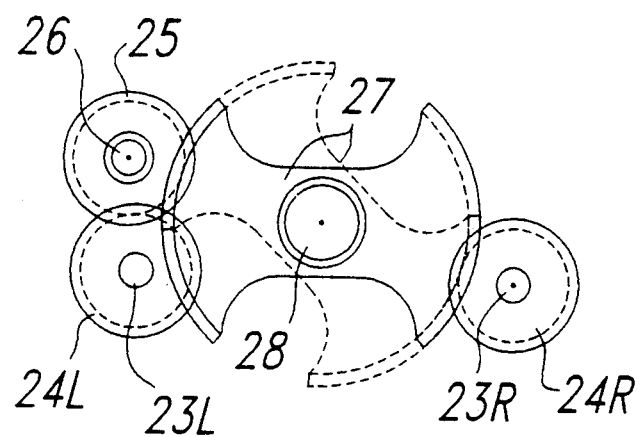
FIG. 13 is a front view of the main portion illustrating the movement mechanism of the left and right wafer pressers in said embodiment.

Since wafer pressers (16L), (16R) are set symmetrically on the left and right sides, it is necessary to position them at the symmetric positions all the time. FIG. 13 is a schematic diagram illustrating the transmission mechanism used for performing this movement. Under driving by a motor and a reducing gear not shown in the figure, shaft (28) is rotated, and driving spur gear (27) is made to rotate between the dash-dot line and the solid line. Driving spur gear (27) engages intermediate spur gear (25) and right-side passive spur gear (24R), and it engages intermediate spur gear (25) and left-side passive spur gear (24L). As driving spur gear (27) exercises the aforementioned rotation, right-side passive spur gear (24R) and intermediate spur gear (25) are rotated over a prescribed angle around shafts (23R) and (26), respectively. In this case, left-side passive spur gear (24L) and right-side passive spur gear (24R) rotate simultaneously over the same angle in directions opposite to each other.

Figure 3:
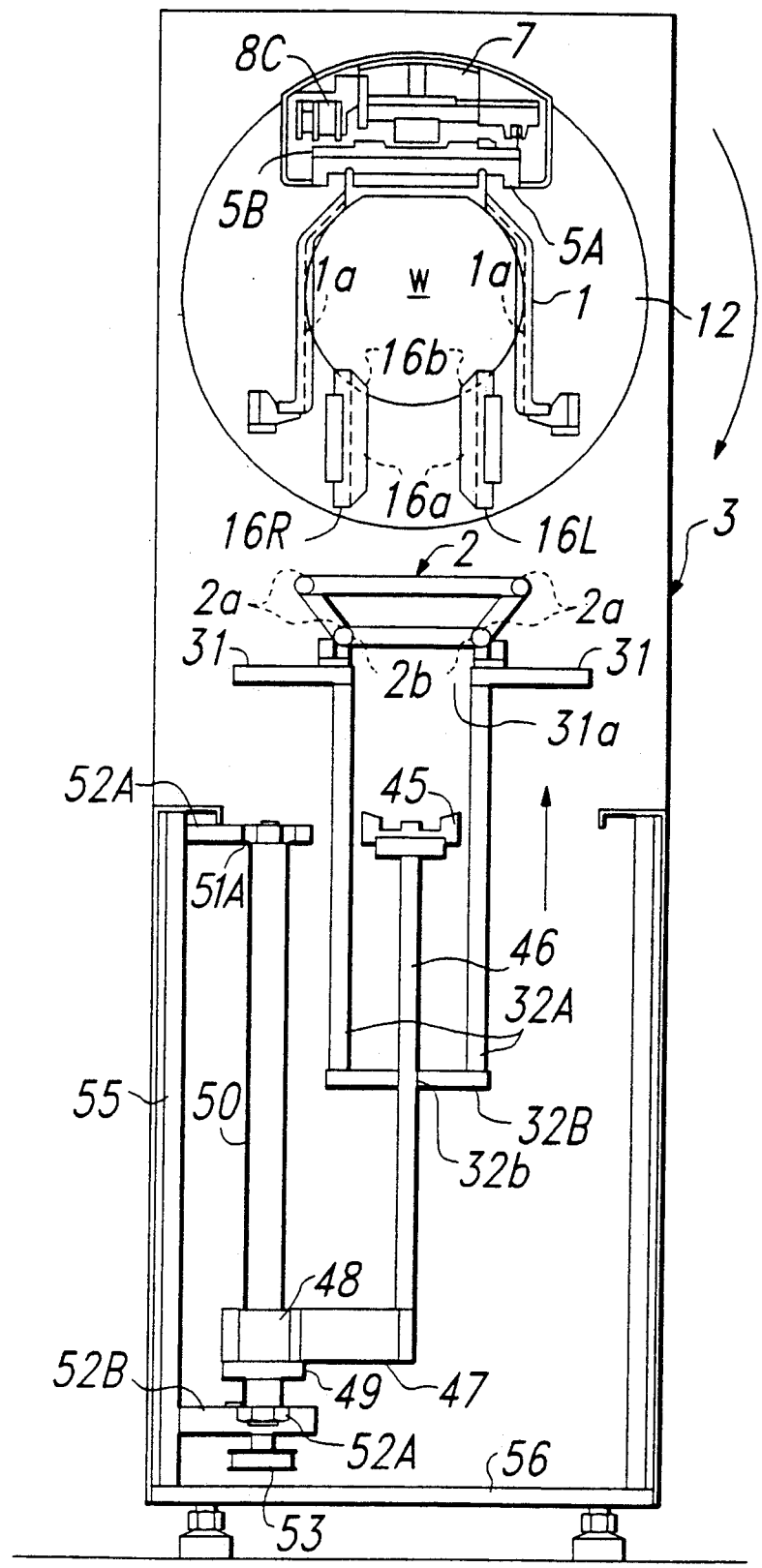
FIG. 3 is a schematic front view illustrating the interior in step 3 of the wafer transferring process in said embodiment.

Then, motor (15) shown in FIG. 8 is driven, and turntable (12) is rotated by 180° as shown in FIG. 3. The angle of rotation is held accurately at 180° by the control with the aid of a photosensor not shown in the figure. In this way, wafer W, carrier (1) and carrier table (5A) become reversed to the position shown in FIG. 2. In this case, as carrier (1) is pressed by carrier table (5A) and carrier presser (29) and wafer W is pressed by carrier (1) and wafer pressers (16L), (16R), carrier (1) and wafer W are steadily supported on turntable (12). Then (or at the same time), boat table (31) carrying the empty boat (2) is raised by the aforementioned mechanism.

Figure 4:
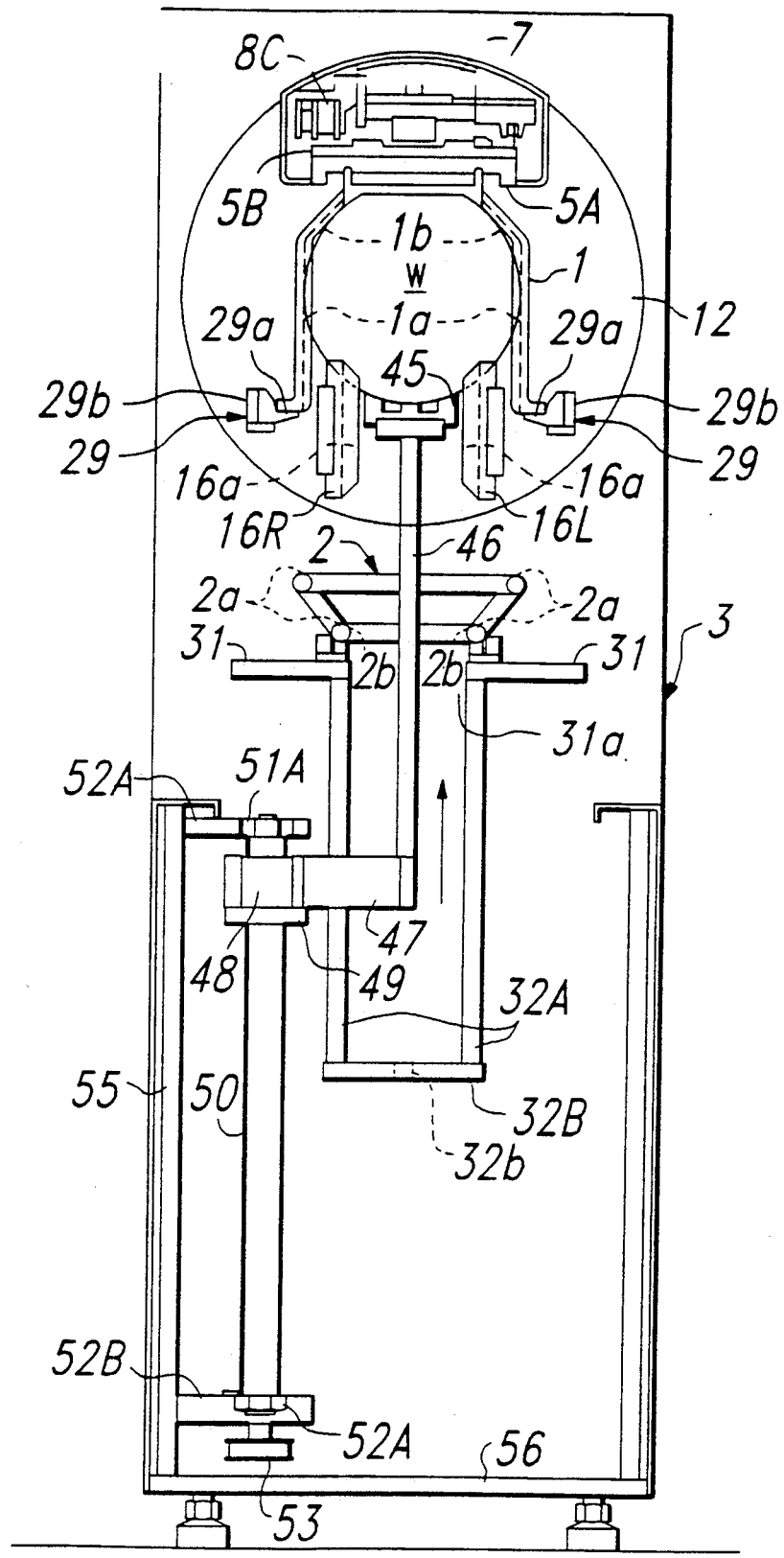
FIG. 4 is a schematic front view illustrating the interior in step 4 of the wafer transferring process in said embodiment.

Then, as shown in FIG. 4, the aforementioned mechanism is used to raise lifter (45) through hole (31a) on boat table (31), and the upper side of lifter (45) supports a portion of the edge of wafer W.

Figure 5:
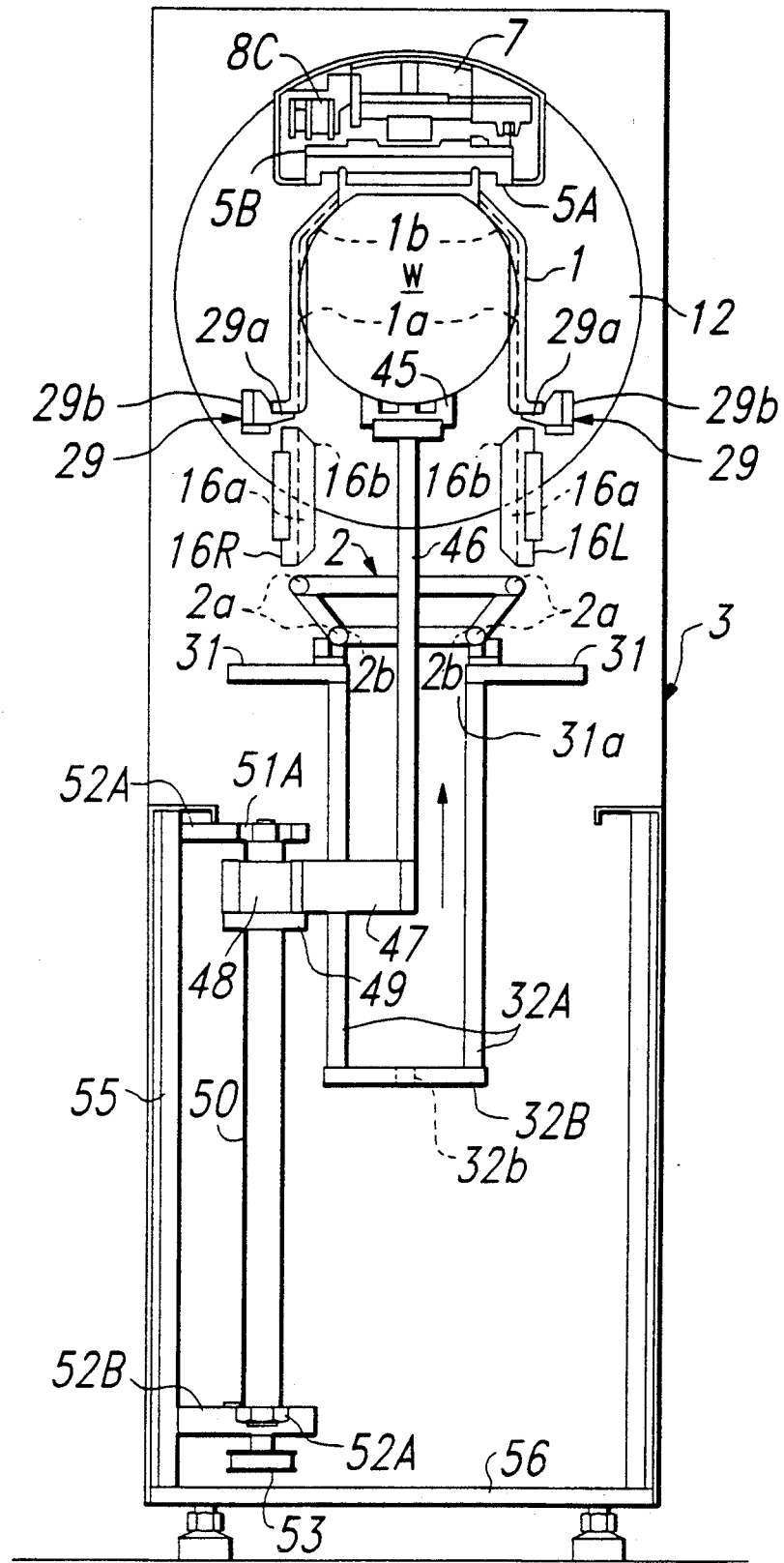
FIG. 5 is a schematic front view illustrating the interior in step 5 of the wafer transferring process in said embodiment.

Then, as shown in FIG. 5, wafer pressers (16L), (16R) are recessed to release the support given to wafer W. In this case, wafer W is supported by lifter (45).

Figure 6:
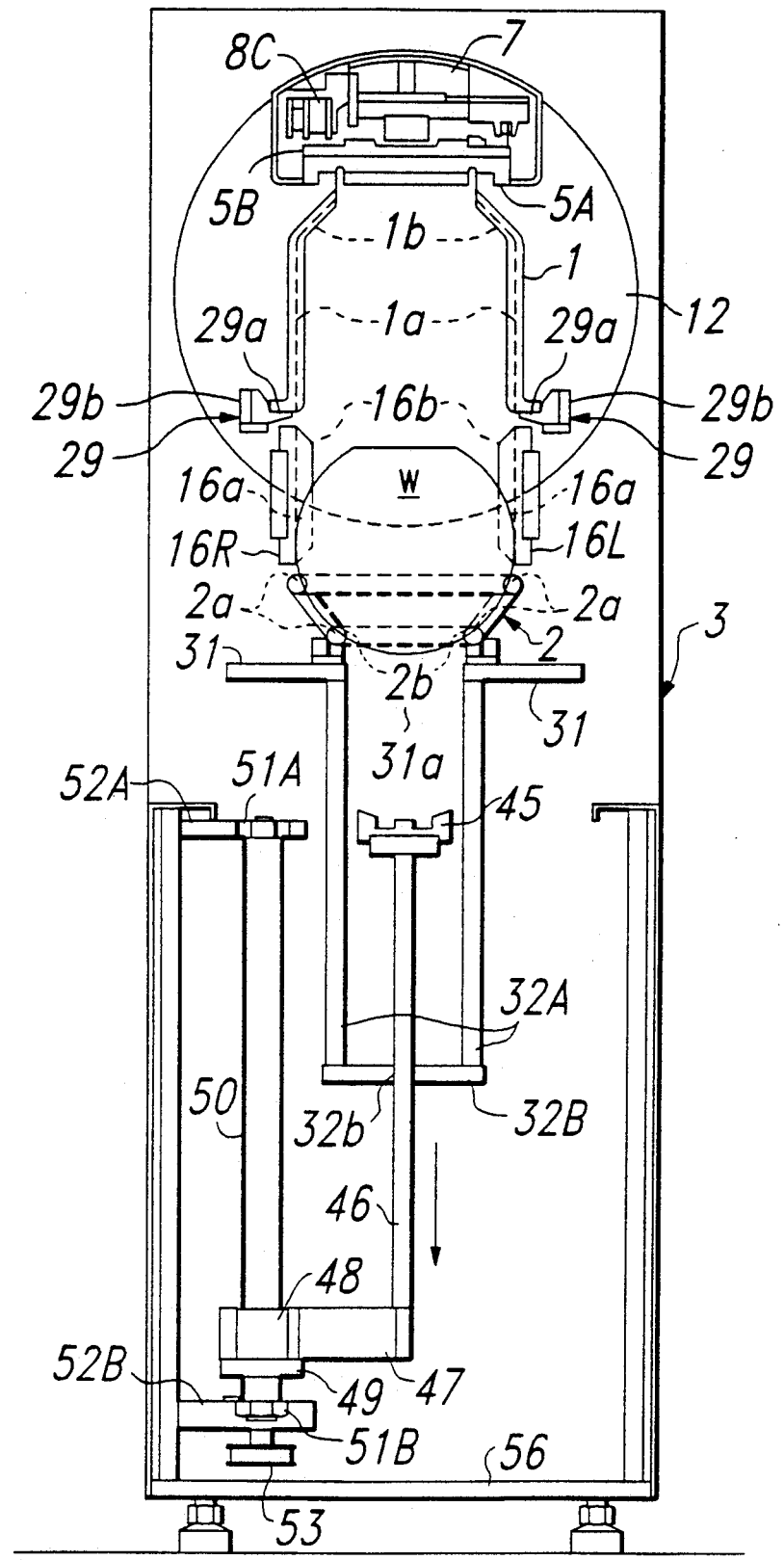
FIG. 6 is a schematic front view illustrating the interior in step 6 of the wafer transferring process in said embodiment.

Then, as shown in FIG. 6, lifter (45) is lowered to its original position. In this case, wafer W is lowered along a correct route as guided by grooves (16a), (16a) of wafer pressers (16L), (16R) until a portion of its periphery is inserted into groove (2a) of boat (2) so that wafer W is contained in boat (2).

Figure 7:
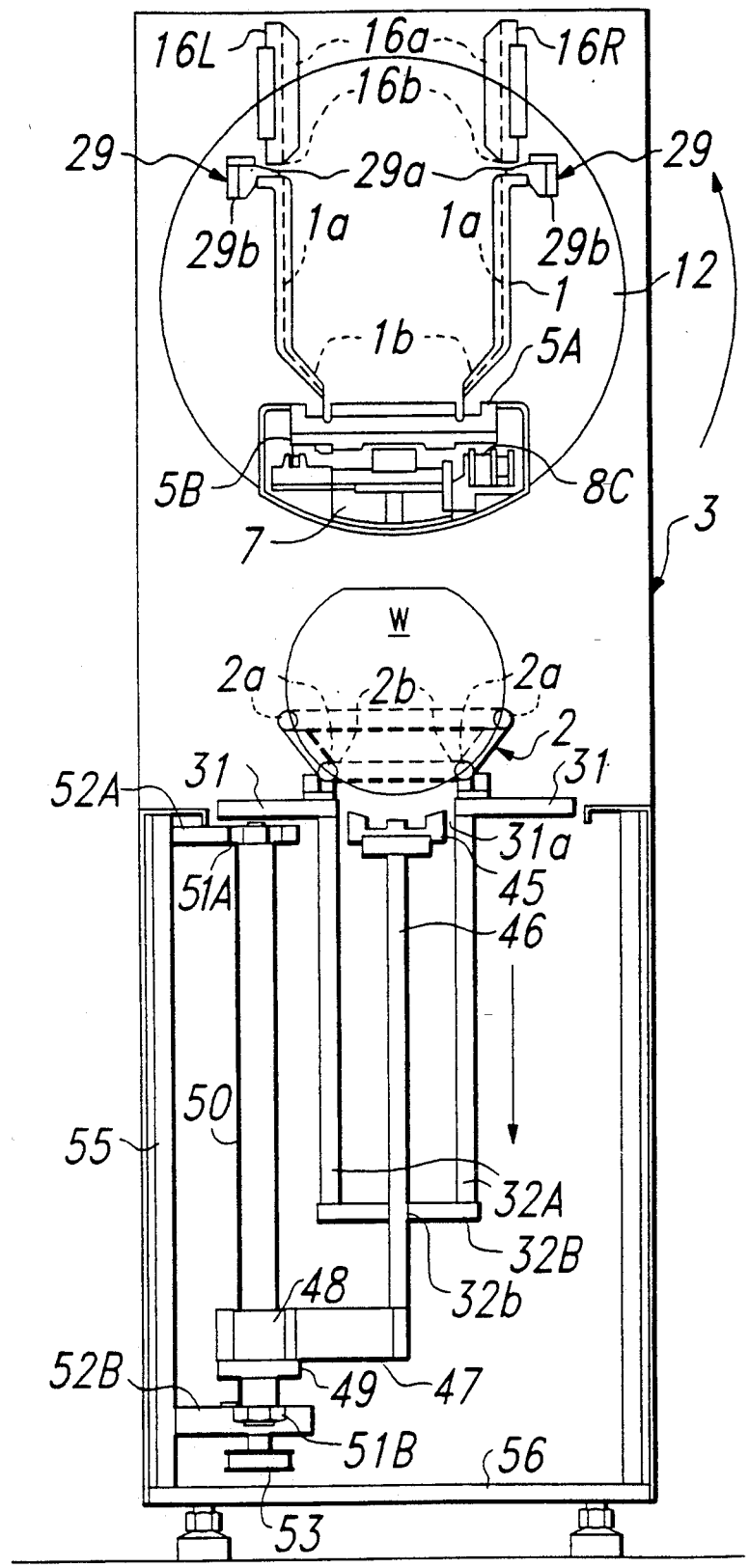
FIG. 7 is a schematic front view illustrating the interior in step 7 of the wafer transferring process in said embodiment.

Then, as shown in FIG. 7, boat table (31) is lowered to its original position; as a result, boat (2) containing wafer W is lowered to its original position. Then, turntable (12) is rotated in reverse (or rotated in the same direction as that in FIG. 3) by 180°, and fixing of carrier (1) by carrier press (29) is released.

Then, boat (2) containing wafer W is withdrawn and is carried to the next stage of operation. As a replacement, an empty boat is now set on boat table (31), and the emptied carrier (1) and a carrier containing wafer are exchanged with each other, and the state returns to that shown in FIG. 1.

The operation for transferring the wafer from the boat to the carrier can be carried out in a procedure reverse to the procedure described with reference to FIGS. 1–7.

The procedure for transferring a wafer between two carriers is basically the same as the aforementioned procedure for transferring a wafer from the carrier to the boat. Since the height of the boat is significantly smaller than the height of the carrier, as in the step shown in FIG. 6, wafer pressers (16L), (16R) play the reliable role as the guide; as shown in FIG. 3, before the wafer transference, the boat is raised; as shown in FIG. 7, in the last step, the boat is lowered to its original position. Consequently, when the wafer is to be transferred between two carriers, there is no need to move vertically one of the carriers. FIGS. 14–17 are front views illustrating the main portion of the interior of the machine in the procedure of transference of wafer between two carriers. A portion of the steps are not shown as they are identical to those in FIGS. 1-7.

Figure 14:
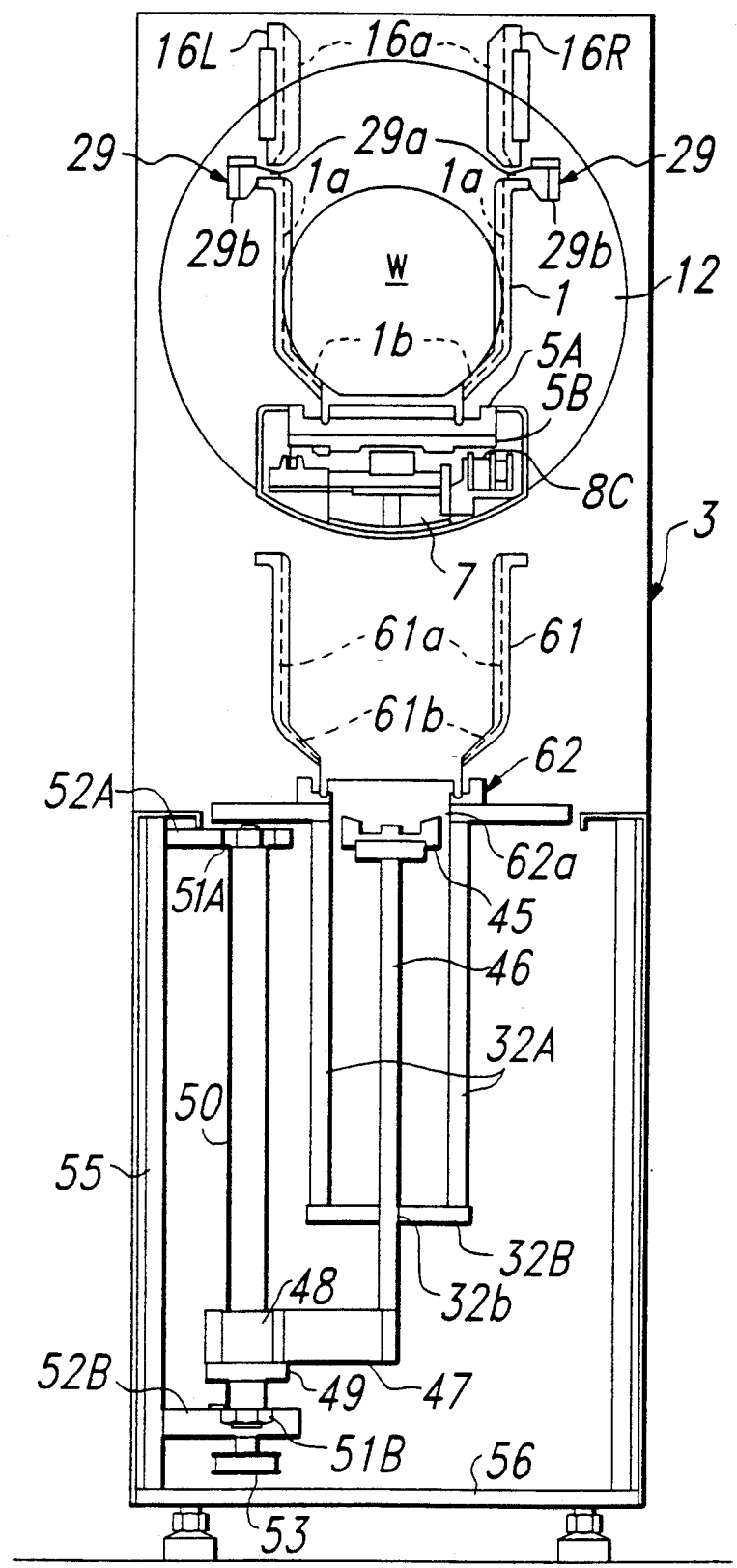
FIG. 14 is a schematic front view of the interior similar to FIG. 1 for the wafer transfer machine in a second embodiment.

First of all, just as shown in FIG. 1, carrier (1) containing wafer W is set on carrier table (5A) supported on turntable (12). Then, in place of boat table (31), another carrier table (62) is mounted, and empty carrier (61) is set in carrier table (62). FIG. 14 shows this state.

Then, as shown in FIG. 2, carrier (1) is pressed by carrier presser (29); then, wafer W is pressed by wafer pressers (16L), (16R). Then, just as in FIG. 3, turntable (12) is rotated over 180°.

Figure 15:
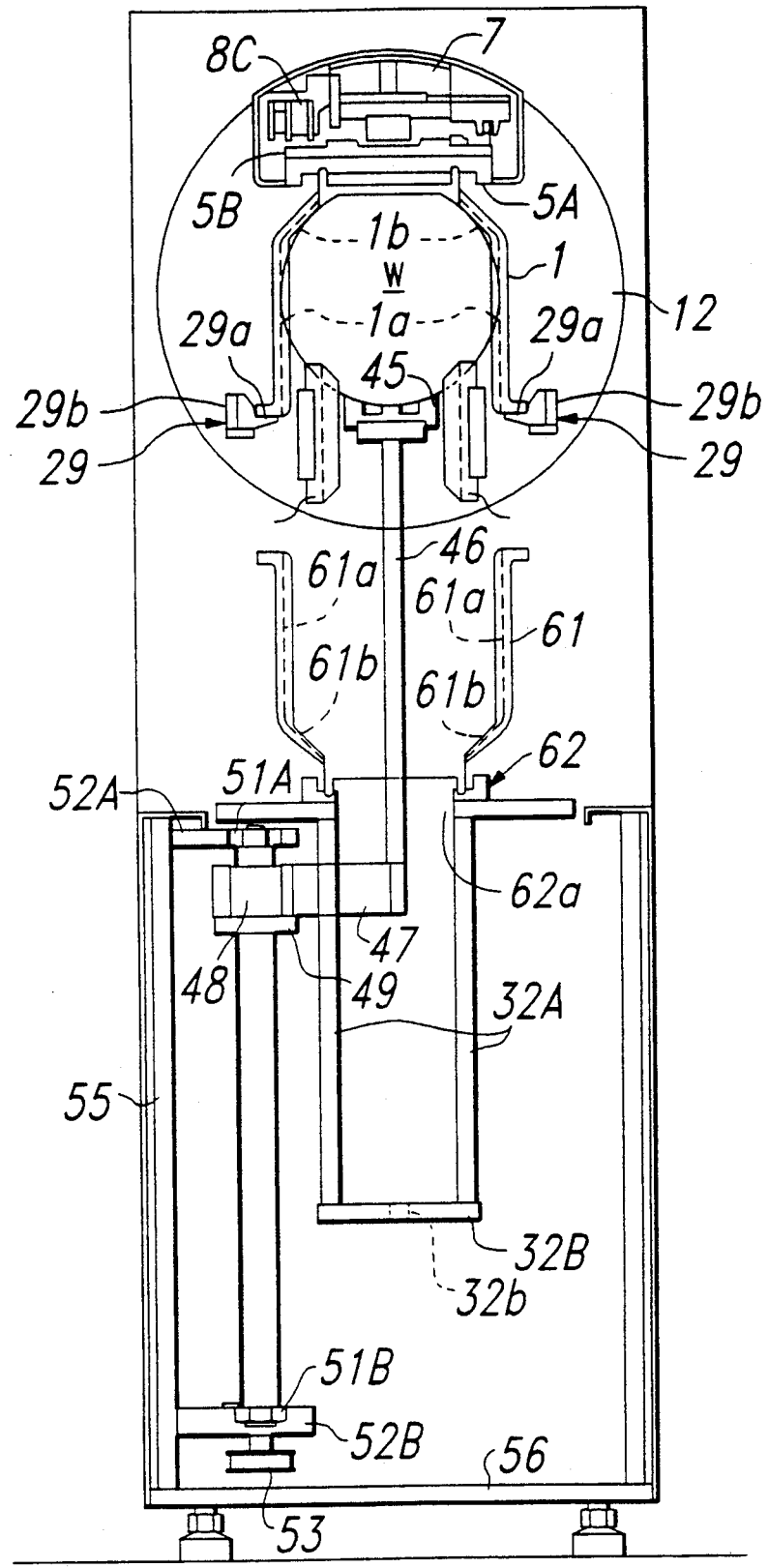
FIG. 15 is a schematic front view similar to FIG. 3 in said second embodiment.

Then, as shown in FIG. 15, lifter (45) is lifted to support wafer W.

Figure 17:
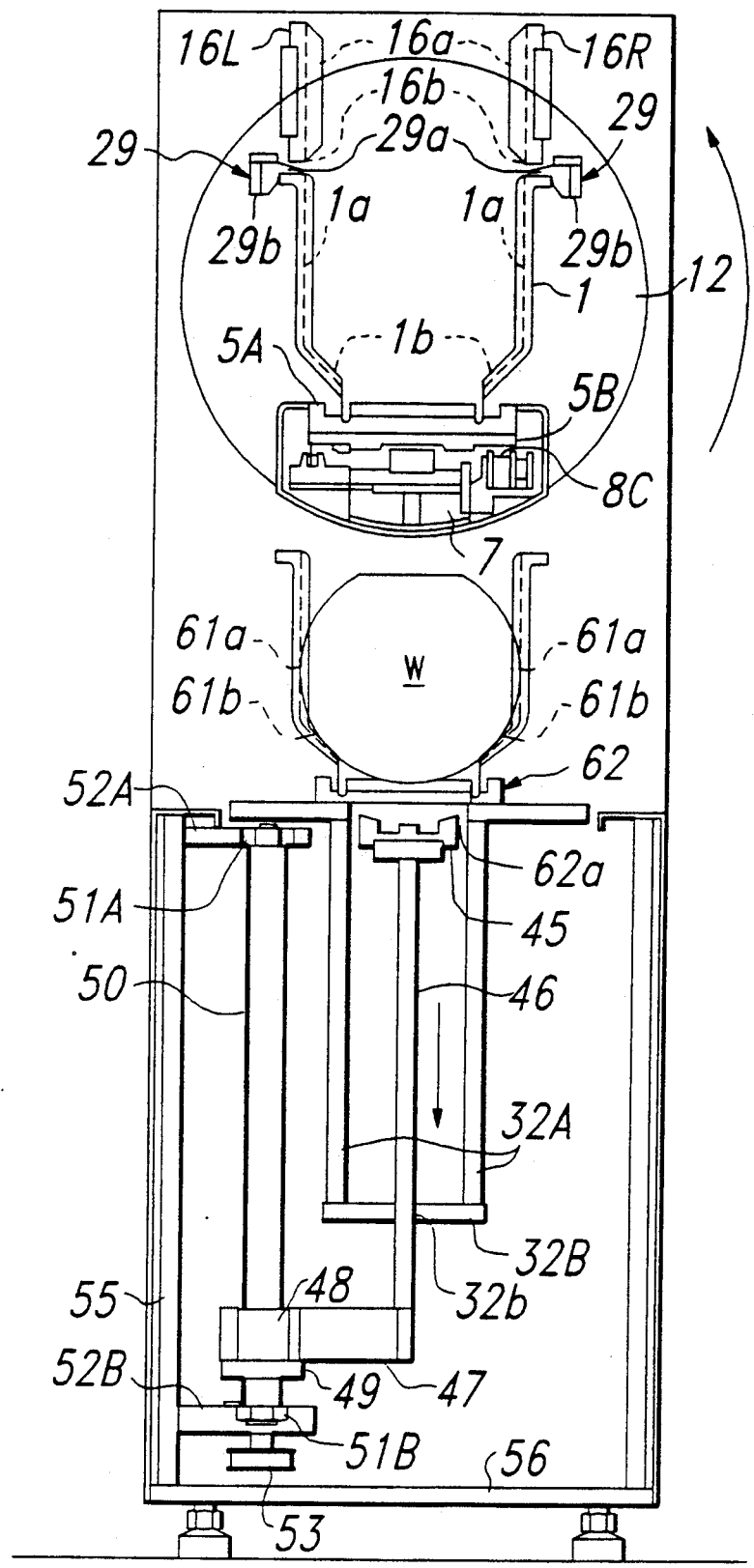
FIG. 17 is a schematic front view of the interior similar to FIG. 7.

Then, just as in FIG. 5, the support to the wafer by the wafer presser is released. Then, as shown in FIG. 17, lifter (45) is lowered to its original position, and wafer W is contained in the lower carrier (61). Wafer W is supported by groove bottom (61b) of carrier (61).

Figure 16:
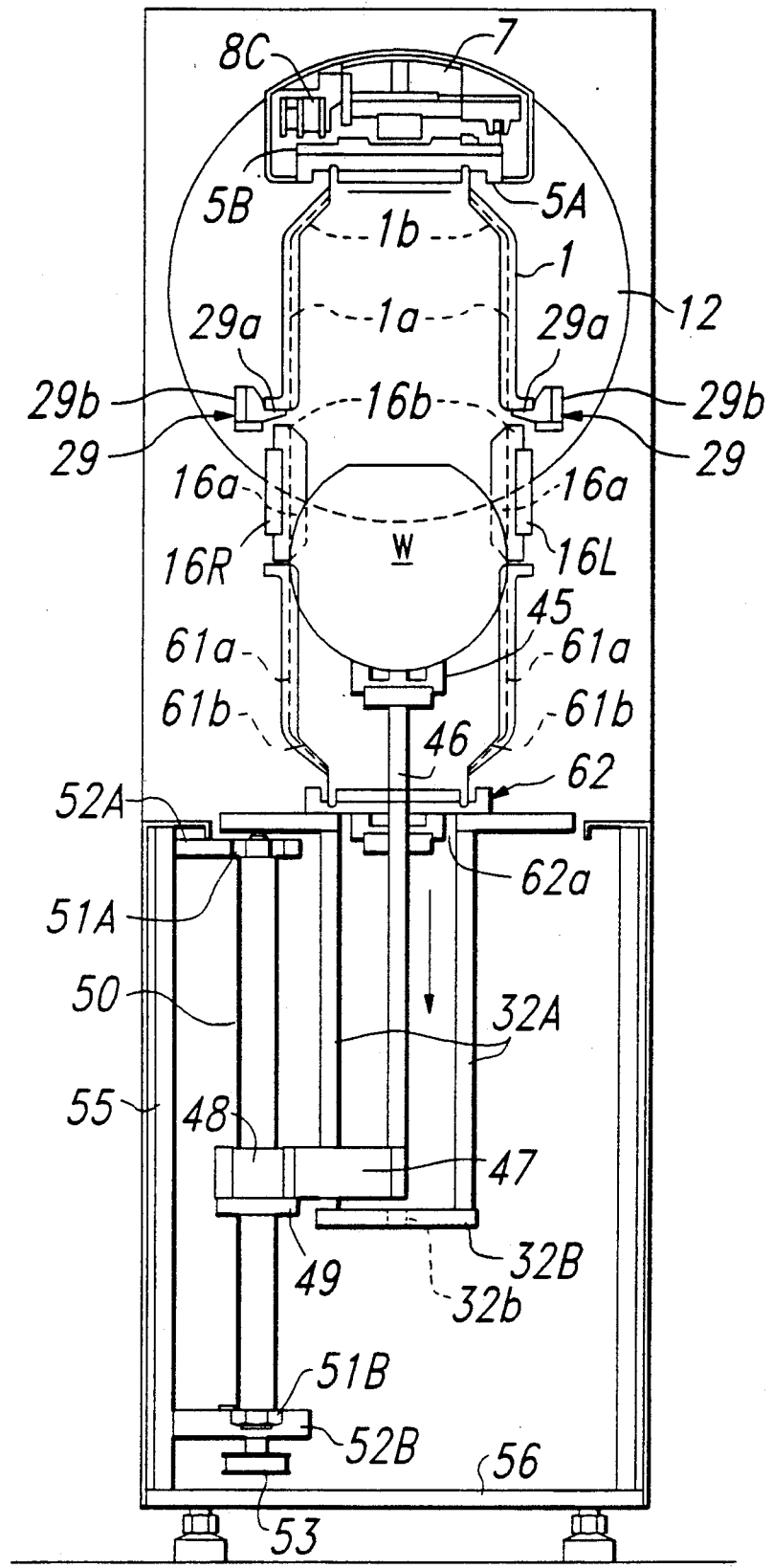
FIG. 16 is a schematic front view of the interior illustrating the movement process from the step shown in FIG. 15 to the step shown in FIG. 17.

In the procedure from the step shown in FIG. 15 to the step shown in FIG. 17, as shown in FIG. 16, a portion of the periphery of wafer W passes grooves (16a), (16a) of wafer pressers (16L), (16R), for which the support to the wafer has been released; that is, grooves (16a), (16a) act as guides for guiding wafer W. As a result, in the procedure of movement from the step shown in FIG. 15 to the step shown in FIG. 17 via the step shown in FIG. 16, wafer W is lowered in sequence as guided by grooves (1a), (1a) of carrier (1), grooves (16a), (16a) of wafer pressers (16L), (16R), and grooves (61a), (61a) of carrier (61) to the correct position.

In all of the aforementioned examples, the carrier containing the wafer is first rotated by 180° to reverse the upper and down sides; then, the wafer is lowered as supported by the lifter, and the wafer is transferred to the empty boat or carrier waiting below it. In this way, with the aid of the rotation and lowering movements, the wafer's movement distance can be shortened, and there is no need to use clamps or other holding means to hold the wafer. Consequently, the undesired dust attachment can be avoided, and no excessive force is applied on the wafer so that the wafer is not broken and no minute debris is formed. In addition, as the wafer is lowered, it is guided by the grooves of the pair of wafer pressers for which the support to the wafer has been released. Consequently, even when the machine does not have a very high precision, the wafer still can be lowered to the correct position. The manufacturing cost of the machine thus can be reduced, and the space occupied by the machine in the width direction can be reduced, too.

Figure 20:
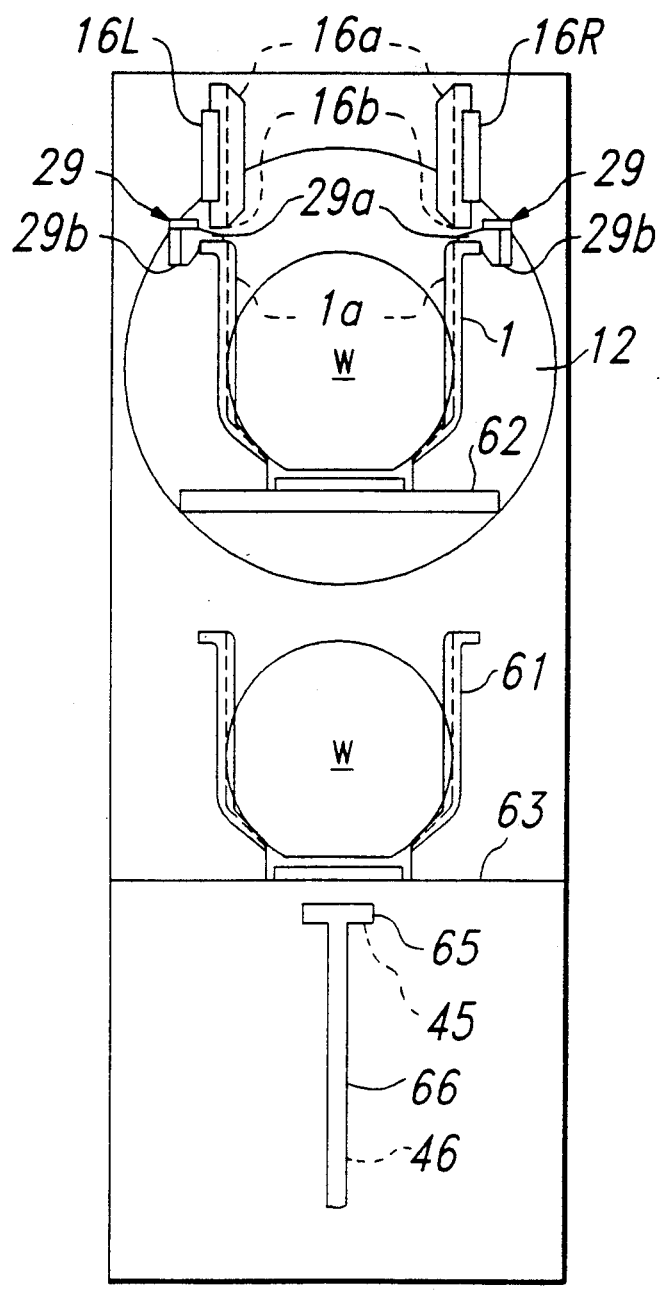
FIG. 20 is a schematic front view of the wafer transfer machine in a third embodiment.
Figure 21:
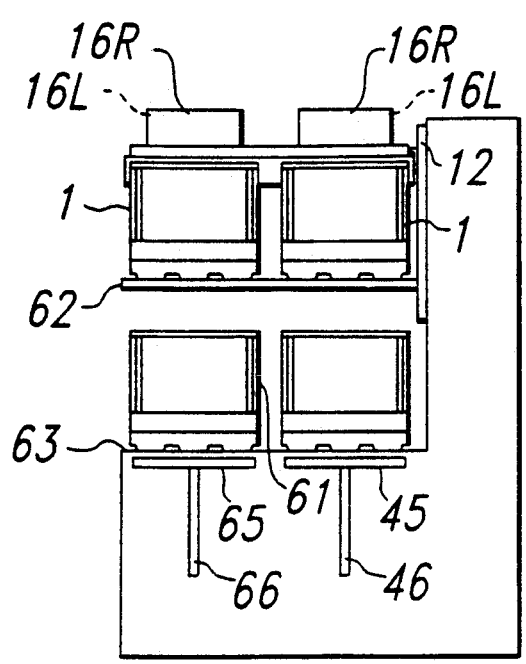
FIG. 21 is a schematic side view of said third embodiment.

FIG. 20 is a schematic front view illustrating another example of the wafer transfer machine. FIG. 21 is its schematic side view. In this example, as shown in FIG. 21, upper carrier table (62) and lower carrier table (63) are extended in the front-rear direction; a plurality (2, in this example) of carriers (1), (1), (61), (61) are carried on these tables in the front-rear direction; wafers W in carriers (1), (1) are transferred at the same time to empty carriers (61), (61). Of course, it is also possible to replace empty carriers (61), (61) by two empty boats so that transference of wafers is carried out between carriers and boats (same as the example shown later with reference to FIGS. 22, 23). The procedure of wafer transference is the same as in the aforementioned example with reference to FIGS. 1–7.

In this way, the efficiency of the wafer transferring operation can be increased by several times (two times in this example), and the productivity is significantly higher.

Figure 23:
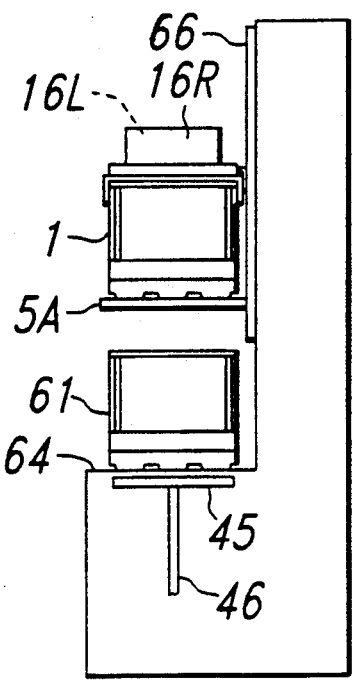
FIG. 23 is a schematic side view of said fourth embodiment.
Figure 24:
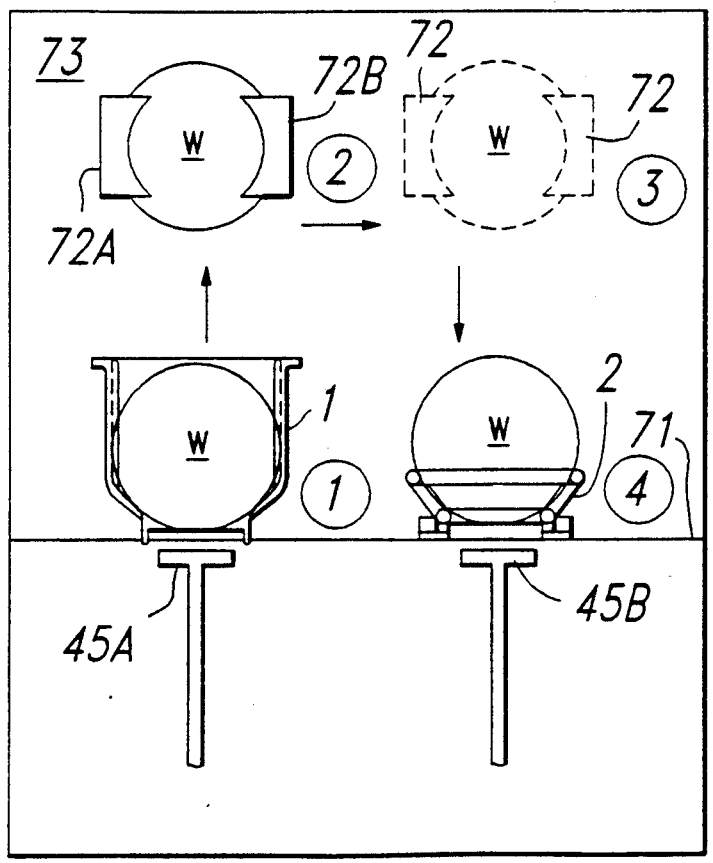
FIG. 24 is a schematic front view of the wafer transfer machine in the conventional scheme.
Figure 25:
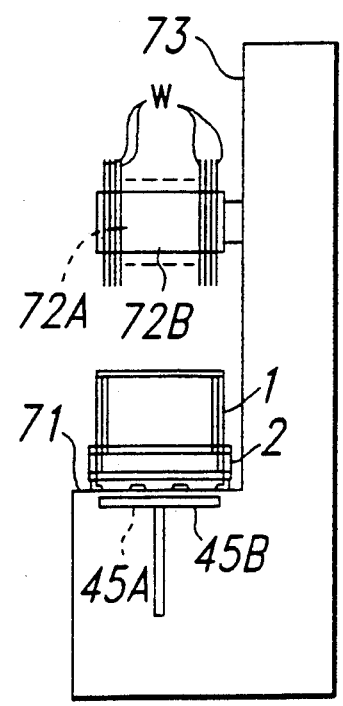
FIG. 25 is a schematic side view of said conventional wafer transfer machine.
Figure 22:
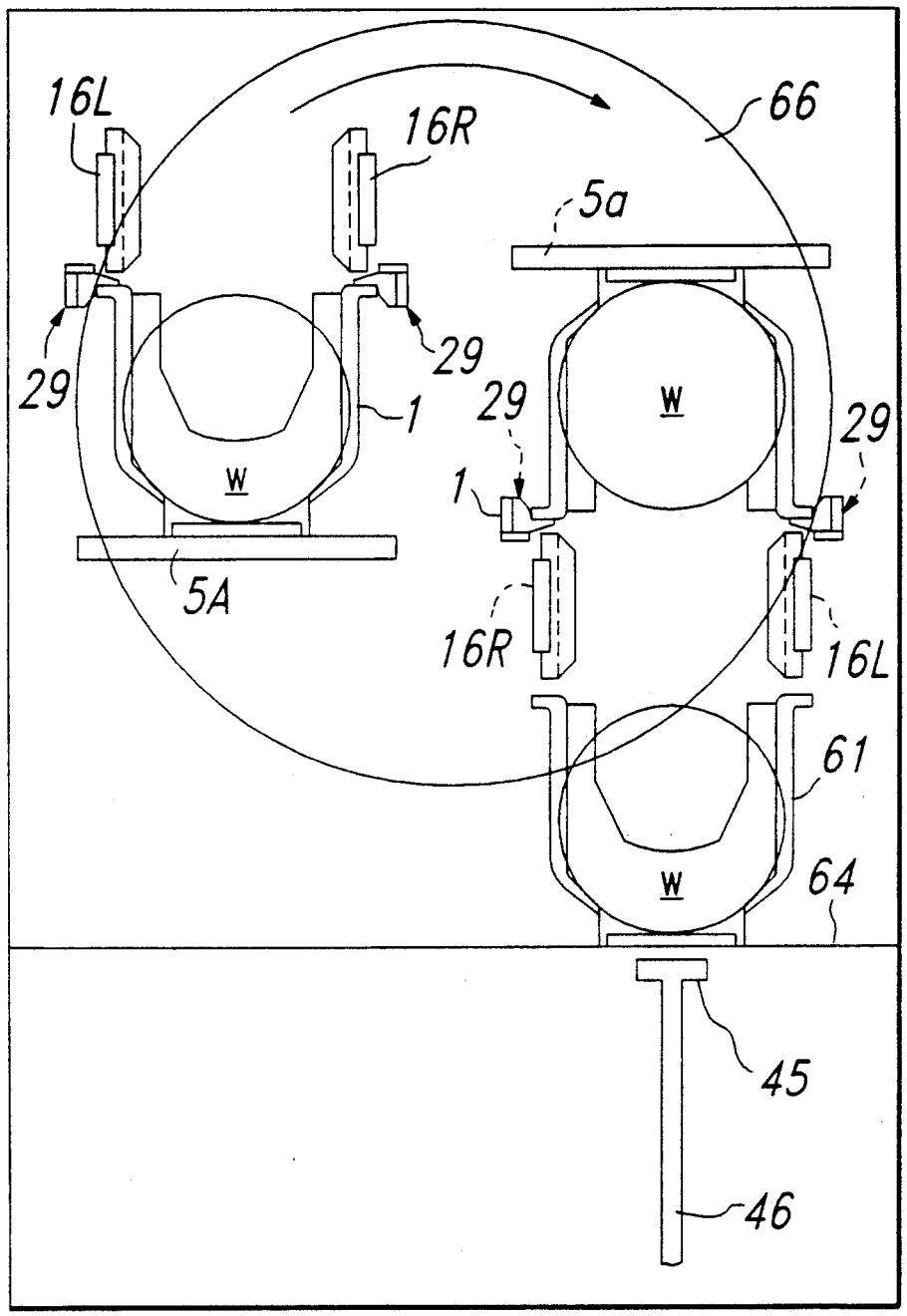
FIG. 22 is a schematic front view of the wafer transfer machine in a fourth embodiment.

FIG. 22 is a schematic front view illustrating yet another example of the wafer transfer machine. FIG. 23 is its schematic side view. In this example, instead of turntable (12) shown in FIGS. 1–7, a turntable (66) with a diameter about twice larger is used. Wafer W is transferred from carrier (1) on carrier table (5A) supported on turntable (66) to an empty carrier (61). As shown in FIG. 22, one carrier table (5A) is located on the left side with respect to the center of turntable (66), empty carrier (61) is set on the other carrier table (64) in the lower side symmetric to carrier (1) with respect to the center of turntable (66). As turntable (66) is rotated by 180°, carrier (1) is reversed at the position indicated by the dash-dot line. In this rotation process, carrier (1) is rotated to above turntable (66) in an arc-shaped movement (clockwise rotation in this example). Then, with the aid of lifter (45), wafer W indicated by double dot-dash line is transferred to standby empty carrier (61) below it as indicated by triple dot-dash line. The other operation features are identical to those shown in FIGS. 1–7.

In this example, in the initial state of carrier (1), empty carrier (61) is not located on the lower side in the vertical direction, and the rotation takes place in the clockwise direction. Hence, there is no trouble with dust attachment caused by driving of the turntable.

In the above, this invention has been explained with reference to several embodiments. However, based on the technical idea of this invention, various variations can be made for the aforementioned embodiments. For example, the driving mechanism of the various driving parts may be changed to other appropriate means; the rotation angle of the turntable may be other than 180°; and an appropriate wafer support means that can perform reciprocal movement may be used to replace the lifter. Wafers may be transferred all at once, or in several rounds. Besides, in addition to the semiconductor wafers, the plate-shaped parts that may be transferred by this invention also include a plate for liquid crystal display device (liquid crystal display panels), other glass substrates, masking substrates, inorganic or organic substrates for compact discs and laser discs, and metal sheets.

For the plate-shaped part transfer machine of this invention, there are a first support means set on the rotating means that supports a first fixture containing a plate-shaped part, a third support means that can make reciprocal movement, and a second support means that guides the plate-shaped part to a second fixture containing a plate-shaped part in the movement of the plate-shaped part; hence, the plate-shaped part can be transferred between the first and second fixtures containing a plate-shaped part in accordance with a rotation movement and the reciprocal movement of the aforementioned third support means. Consequently, for this movement, the efficiency of the movement is high, and the distance of movement of the plate-shaped part is short; hence, there is less chance for dust to attach to the plate-shaped part, and the degradation in the quality caused by the attached dust can be significantly alleviated. In addition, there is no need to hold the plate-shaped part; hence, damage to the plate-shaped part can be prevented. Furthermore, since the plate-shaped part is guided by the aforementioned second support means, there is no need to have a high precision for the overall machine for positioning the first and second fixtures containing a plate-shaped part. Consequently, maintenance of the machine can be carried out easily.

As the wafer only needs to perform the rotation and vertical movement, the wafer movement distance is short; hence, it is effective to prevent attachment of dust to the wafer and the degradation in the quality of the wafer caused by the dust attachment.

As there is no need to hold the wafer, there is no excessive force applied to the wafer, and the wafer cannot be damaged in this case.

As the wafer is guided during its movement, there is no need to have a high precision mechanism for correctly positioning the carrier and the boat, and the maintenance of the machine is easier.

What is claimed is:

1. A wafer transfer machine comprising:
   a first fixture having a horizontally disposed longitudinal axis for receiving wafers arranged in parallel relation with respect to each other along the longitudinal axis of the first fixture;
   a second fixture having a longitudinal axis disposed in vertically spaced parallel relationship with respect to said first fixture for receiving wafers;
   first supporting means engageable with said first fixture for temporarily supporting said first fixture and movable in relation to said first fixture in a direction for detaching from said first fixture;
   a turntable on which said first fixture is disposed;
   means for rotating said turntable about an axis coincident with the center of said turntable and through an arc for moving said first fixture and said first supporting means in a manner such that the position of said first fixture is reversed relative to said second fixture;
   second supporting means mounted on said turntable and engageable with a wafer received in said first fixture for temporarily supporting the wafer in said first fixture and movable with said turntable to respectively release the wafer in a first position and to guide the wafer in a second position; and
   third supporting means reciprocally movable between said first fixture and said second fixture for transferring at least one wafer from a first support position in said first fixture as determined by said second supporting means, and following the rotation of said turntable to reposition said second supporting means and said at least one wafer releasably supported thereby, to a second support position in said second fixture.

2. A wafer transfer machine as set forth in claim 1, wherein said first fixture defines a carrier and said second fixture defines a boat.

3. A wafer transfer machine as set forth in claim 2, wherein said at least one wafer is transferable from the boat as defined by said second fixture to the carrier as defined by said first fixture in response to reciprocal movement of said third supporting means between said first fixture and said second fixture in a direction toward said first fixture;

said second supporting means temporarily supporting said at least one wafer; and said turntable being rotatable in a reverse direction about an axis coincident with the center of said turntable and through an arc for moving said first fixture from its reversed position in relation to said second fixture back to the original position of said first fixture following disposition of said at least one wafer in the carrier as defined by said first fixture.

4. A wafer transfer machine as set forth in claim 2, wherein said second supporting means comprises a pair of spaced apart wafer presser members mounted on said turntable and movable between a first wafer-engaging position in which said wafer presser members respectively support the wafer and a second position in which the wafer presser members are spaced further apart and serve as guide members directing the wafer into the boat as defined by said second fixture.

5. A wafer transfer machine as set forth in claim 2, wherein said first supporting means comprises a carrier presser member having a pair of arms movable into and out of engagement with opposite sides of the carrier as defined by said first fixture for temporarily supporting said first fixture; and means operably connected to said carrier presser member for moving said carrier presser members into and out of engagement with the carrier as defined by said first fixture.

6. A wafer transfer machine as set forth in claim 1, wherein said first fixture defines a first carrier and said second fixture defines a second carrier.

7. A wafer transfer machine as set forth in claim 1, wherein plural sets of first and second fixtures, and first, second, and third supporting means are provided for simultaneous transfer of at least one wafer between the corresponding first and second fixtures of each set.

8. A wafer transfer machine as set forth in claim 7, wherein said first and second fixtures of each of said plural sets define respective carriers.

9. A wafer transfer machine as set forth in claim 1, wherein a pair of said first fixtures together with corresponding first and second supporting means are provided;

the longitudinal axes of said pair of first fixtures being disposed in parallel relationship with respect to the axis of rotation of said turntable coincident with the center of said turntable;

the rotation of said turntable through an arc about the axis coincident with the center of said turntable moving said pair of first fixtures and said first supporting means corresponding thereto such that one of said pair of first fixtures is disposed in a reversed position in relation to said second fixture for enabling wafer transfer therebetween; and the subsequent rotation of said turntable in the same direction as the first-mentioned rotation and through a second arc moving said pair of first fixtures and said first supporting means corresponding thereto such that the other of said pair of first fixtures is disposed in a reversed position in relation to said second fixture for enabling wafer transfer therebetween.

* * * * *